United States Patent
Seo et al.

(10) Patent No.: US 7,038,972 B2
(45) Date of Patent: May 2, 2006

(54) DOUBLE DATA RATE SYNCHRONOUS DYNAMIC RANDOM ACCESS MEMORY SEMICONDUCTOR DEVICE

(75) Inventors: Sung-min Seo, Yongin (KR); Chi-wook Kim, Kyungki-do (KR); Kyu-hyoun Kim, Suwon (KR)

(73) Assignee: Samsung Eletronics Co., Ltd., Suwon-si (KR)

( * ) Notice: Subject to any disclaimer, the term of this patent is extended or adjusted under 35 U.S.C. 154(b) by 207 days.

(21) Appl. No.: 10/793,209

(22) Filed: Mar. 4, 2004

(65) Prior Publication Data

US 2004/0174765 A1    Sep. 9, 2004

(30) Foreign Application Priority Data

Mar. 4, 2003    (KR) .................. 10-2003-0013423

(51) Int. Cl.
   *G01C 8/00*    (2006.01)
(52) U.S. Cl. .................. 365/233; 365/194; 365/189.05
(58) Field of Classification Search ................ 365/233, 365/194, 189.05
   See application file for complete search history.

(56) References Cited

U.S. PATENT DOCUMENTS

| 6,215,726 | B1 * | 4/2001 | Kubo | .................. 365/194 |
| 6,768,698 | B1 * | 7/2004 | Kono | .................. 365/189.05 |
| 6,778,464 | B1 * | 8/2004 | Chung | .................. 365/233 |

FOREIGN PATENT DOCUMENTS

| JP | 2002043934 | 2/2002 |
| JP | 2002230972 | 8/2002 |

\* cited by examiner

*Primary Examiner*—Huan Hoang
(74) *Attorney, Agent, or Firm*—F. Chau & Associates, LLC

(57) ABSTRACT

A double data rate ("DDR") synchronous dynamic random access memory ("SDRAM") semiconductor device is provided that prevents a conflict between data read from and data written to the DDR SDRAM semiconductor device when data is written to the DDR SDRAM semiconductor device, which includes a delay locked loop ("DLL") circuit, a clock signal control unit, an output unit, and an output control unit, where the DLL circuit compensates for skew of an input clock signal and generates an output clock signal; the clock signal control unit receives a read signal activated when data stored in the DDR SDRAM semiconductor device is read out, a DLL locking signal activated when the DLL circuit performs a locking operation on the input clock signal, and the output clock signal, and outputs the output clock signal when either the read signal or the DLL locking signal is active; the output unit buffers data stored in the DDR SDRAM semiconductor device and outputs the data to outside of the DDR SDRAM semiconductor device in synchronization with the output clock signal output from the clock signal control unit; and the output control unit receives the output clock signal output from the clock signal control unit, and the read signal, and outputs the read signal to the output unit in synchronization with the output clock signal output from the clock signal control unit.

20 Claims, 2 Drawing Sheets

DOUBLE DATA RATE SYNCHRONOUS DYNAMIC RANDOM ACCESS MEMORY SEMICONDUCTOR DEVICE

CROSS REFERENCE TO RELATED APPLICATION

This application claims foreign priority under 35 U.S.C. § 119 to Korean Patent Application No. 2003-13423, filed on 4 Mar. 2003, in the Korean Intellectual Property Office.

BACKGROUND OF THE INVENTION

1. Field of the Invention

The present invention relates to semiconductor memory devices, and more particularly, to semiconductor memory devices that prevent conflicts between data read from and data written to the devices.

2. Description of the Related Art

In general, a DDR SDRAM semiconductor device is connected to a DRAM controller. The DRAM controller writes data to and reads data from the DDR SDRAM semiconductor device. The DDR SDRAM semiconductor device includes a memory bank that stores data, a delay locked loop ("DLL") circuit that generates a clock signal, an output buffer that buffers data stored in the memory bank and outputs the buffered data in synchronization with the clock signal, and an output controller that controls the operation of the output buffer.

FIG. 1 shows a timing diagram, indicated generally by the reference numeral 100, describing a malfunction of a conventional DDR SDRAM semiconductor device when the DRAM controller writes data to the DDR SDRAM semiconductor device. Hereinafter, the reason for the malfunction will be described with reference to FIG. 1.

Once the DRAM controller applies a read command RD to the DDR SDRAM semiconductor device and a CAS latency elapses, the output buffer outputs data DQR. At this time, the data DQR is output from the output buffer in synchronization with a clock signal CLK_DLL output from the DLL circuit.

The output controller receives the clock signal CLK_DLL and the read command RD. While receiving the clock signal CLK_DLL, the output controller activates the output buffer when the read command RD is active and deactivates the output buffer when the read command RD is inactive. This operation prevents unnecessary power consumption by the output buffer.

Once a precharge command PR is applied to the memory bank after the output buffer has output data DQR, the clock signal CLK_DLL is not output to the output controller any more. This state is maintained while the DLL circuit is reset and completes a locking operation on a signal input to the DLL circuit, i.e., during a period tD. At this time, the output controller should deactivate the output buffer because the read command RD is inactive. However, since the clock signal CLK_DLL has not been input to the output controller, the output controller may erroneously apply an active read command RD latched therein to the output buffer to activate the output buffer. Then, if data DQR generated in the DDR SDRAM semiconductor device is input to the output buffer, the output buffer outputs data DQR to the DRAM controller without receiving the read command RD.

Thereafter, when a write command WR becomes active, and thus, the DRAM controller writes data DQW to the DDR SDRAM semiconductor device, a conflict occurs between data DQW written to the DDR SDRAM semiconductor device and data DQR output from the DDR SDRAM semiconductor device. Such a conflict causes malfunction of the DDR SDRAM semiconductor device.

SUMMARY OF THE INVENTION

These and other drawbacks and disadvantages of the prior art are addressed by a semiconductor memory device that prevents a conflict between data read from the device and data written to the device.

A semiconductor memory device includes a delay locked loop ("DLL") circuit for receiving an input clock signal and generating a deskewed output clock signal, an output unit for buffering data stored within the semiconductor memory device and outputting the data, and an output control unit in signal communication with the DLL circuit and the output unit for deactivating the output unit when the DLL circuit performs a locking operation on the input clock signal.

These and other aspects, features and advantages of the present disclosure will become apparent from the following description of exemplary embodiments, which is to be read in connection with the accompanying drawings.

BRIEF DESCRIPTION OF THE DRAWINGS

The above and other aspects and advantages of the present invention will become more apparent by describing in detail exemplary embodiments thereof with reference to the attached drawings, in which.

DETAILED DESCRIPTION OF PREFERRED EMBODIMENTS

Figure 1:
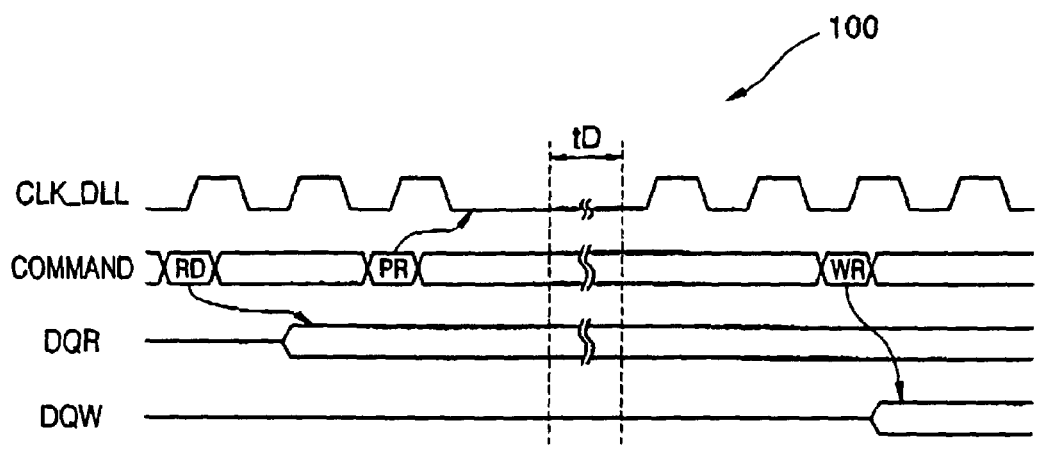
FIG. 1 is a timing diagram describing a malfunction of a conventional DDR SDRAM semiconductor device when data is written to the DDR SDRAM semiconductor device.

The present invention will now be described more fully with reference to the accompanying drawings, in which preferred embodiments of the invention are shown. In the drawings, the same reference numerals have been used, where possible, to designate the same elements.

Figure 2:
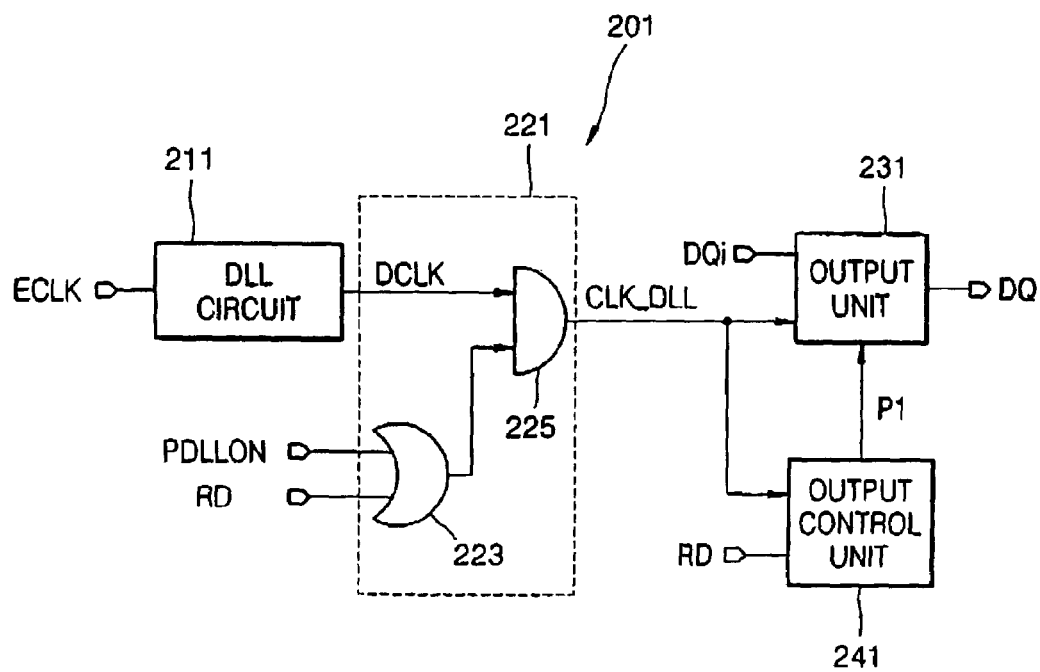
FIG. 2 is a block diagram illustrating a DDR SDRAM semiconductor device according to an embodiment of the present invention.

FIG. 2 shows a block diagram illustrating a double data rate ("DDR") synchronous dynamic random access memory ("SDRAM") semiconductor device according to the present invention. Referring to FIG. 2, a DDR SDRAM semiconductor device 201 includes a delay locked loop ("DLL") circuit 211, a clock signal control unit 221, an output control unit 241, and an output unit 231.

The DLL circuit 211 compensates for skew of an input clock signal ECLK and generates an output clock signal DCLK. The clock signal control unit 221 includes a first logic unit 223 and a second logic unit 225.

The first logic unit 223 receives a read signal RD and a DLL locking signal PDLLON. When either the read signal RD or the DLL locking signal PDLLON is active, the first logic unit 223 activates its output signal. When both the read signal RD and the DLL locking signal PDLLON are inactive, the first logic unit 223 deactivates its output signal. The read signal RD becomes active when data stored in the DDR SDRAM semiconductor device 201 is read out. The DLL locking signal PDLLON becomes active when the DLL circuit 211 is reset and performs a locking operation on the input clock signal ECLK. The first logic unit 223 may be an OR gate.

The second logic unit 225 receives the output signal of the first logic unit 223 and the output clock signal DLCK of the DLL circuit 211. When the output signal of the first logic unit 223 is active, the second logic unit 225 outputs a clock signal CLK_DLL. When the output signal of the first logic unit 223 is inactive, the second logic unit 225 does not output the clock signal CLK_DLL. The second logic unit 225 may be an AND gate.

The output control unit 241 receives the read signal RD and the clock signal CLK_DLL output from the second logic unit 225 and outputs the read signal RD as a control signal P1 to the output unit 231 in synchronization with the received clock signal CLK_DLL. The output control unit 241 will be further discussed with reference to FIG. 3.

The output unit 231 receives data DQi stored in the DDR SDRAM semiconductor device, the clock signal CLK_DLL output from the second logic unit 225, and the control signal P1 output from the output control unit 241. The output unit 231 is activated when the control signal P1 becomes active. When the control signal P1 becomes inactive, the output unit 231 is deactivated. Thus, when the control signal P1 is active, the output unit 231 buffers and outputs data DQi stored in the DDR SDRAM semiconductor device 201 as data DQ, in synchronization with the clock signal CLK_DLL output from the second logic unit 225. When the control signal P1 is inactive, the output unit 231 does not output data DQ.

When signals DCLK, CLK_DLL, RD, and PDLLON are active, they are logic high, and when they are inactive, they are logic low. However, in an alternative embodiment, the relationship between the signals and their logic states may be reversed.

Figure 3:
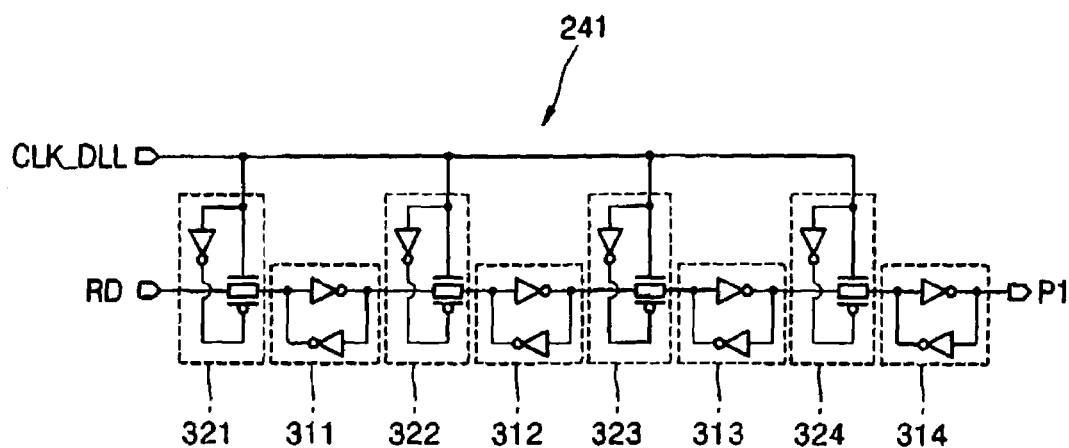
FIG. 3 is a circuit diagram illustrating an output control unit of FIG. 2.

FIG. 3 shows a circuit diagram illustrating the output control unit 241 of FIG. 2. Referring to FIG. 3, the output control unit 241 includes a plurality of latch circuits 311, 312, 313 and 314, and a plurality of transmission gates 321, 322, 323 and 324.

The transmission gates 321, 322, 323 and 324 receive the clock signal CLK_DLL output from the second logic unit 225 of FIG. 2. When the clock signal CLK_DLL is logic high, the transmission gates 321, 322, 323 and 324 are activated and output the received read signal RD. When the clock signal CLK_DLL is logic low, the transmission gates 321, 322, 323, and 324 are deactivated and do not output the received read signal RD.

The latch circuits 311, 312, 313 and 314 latch and output the received read signal RD. During the input of the clock signal CLK_DLL, the received read signal RD passes through the latch circuits 311, 312, 313 and 314, and is output as the control signal P1. As will be recognized by those of ordinary skill in the pertinent art, the number of latch circuits and transmission gates is subject to change with the configuration of the output control unit 241.

Figure 4:
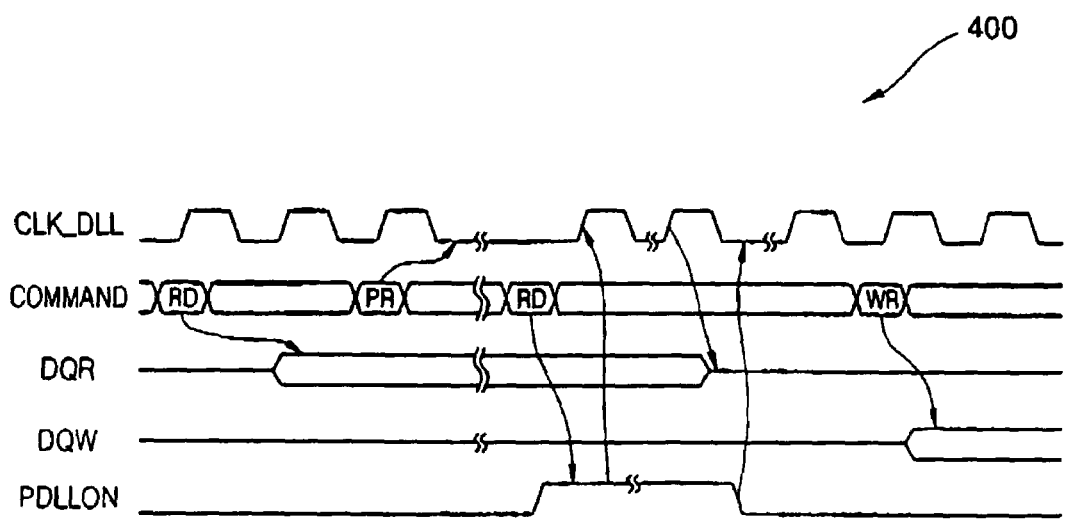
FIG. 4 is a timing diagram for signals of FIG. 2.

FIG. 4 shows a timing diagram, indicated generally by the reference numeral 400, for signals DCLK, CLK_DLL, RD and PDLLON, all of FIG. 2. Hereinafter, the DDR SDRAM semiconductor device 201 of FIG. 2 will be described with reference to FIG. 4.

When data DQi stored in the DDR SDRAM semiconductor device 201 is read out, the read signal RD input to the first logic unit 223 and the output control unit 241, is activated, and the output clock signal DLCK is output from the DLL circuit 211. Then, the clock signal CLK_DLL is output from the second logic unit 225 and applied to the output unit 231 and the output control unit 241. When the control signal P1 output from the output control unit 241 becomes active, the output unit 231 is activated and outputs data DQ to the outside of the DDR SDRAM semiconductor device 201.

Once a data read operation has been completed, the read signal RD becomes inactive and is input to the DLL circuit 211. Then, the DLL circuit 211 is reset and performs the locking operation on the input clock signal ECLK. During the locking operation, the DLL locking signal PDLLON becomes active, i.e., logic high. As a result, the first logic unit 223 outputs a high signal to the second logic unit 225 and the second logic unit 225 outputs the clock signal CLK_DLL. Then, the output control unit 241 outputs the inactive control signal P1 in synchronization with the clock signal CLK_DLL output from the second logic unit 225. Since the control signal P1 output from the output control unit 241 is inactive, i.e., logic low, the output unit 231 is deactivated and does not output data DQ.

Here, since the DLL SDRAM semiconductor device 201 deactivates the output unit 231 while the DLL circuit 211 is reset and performs the locking operation, when data is written to the DR SDRAM semiconductor device 201 from outside, the output unit 231 cannot output any data. Therefore, when data is written to the DDR SDRAM semiconductor 201, no conflict occurs between data read from and written to the DDR SDRAM semiconductor device 201.

As described above, since no conflict occurs between the data read from and the data written to the DDR SDRAM semiconductor device according to the present invention, when data is written thereto, the DDR SDRAM semiconductor device does not exhibit the conventional malfunction during the data write operation.

While the present invention has been particularly shown and described with reference to exemplary embodiments thereof, it will be understood by those of ordinary skill in the pertinent art that various changes in form and details may be made therein without departing from the spirit and scope of the invention as defined by the appended claims and their equivalents.

What is claimed is:

1. A double data rate ("DDR") synchronous dynamic random access memory ("SDRAM") semiconductor device comprising:
   a delay locked loop ("DLL") circuit, which compensates for skew of an input clock signal and generates an output clock signal;
   an output unit, which buffers data stored in the DDR SDRAM semiconductor device and outputs the data to the outside of the DDR SDRAM semiconductor device; and
   an output control unit, which deactivates the output unit while the DLL circuit performs a locking operation on the input clock signal.

2. The DDR SDRAM semiconductor device of claim 1, wherein when the output unit becomes inactive, the output unit does not output data to the outside of the DDR SDRAM semiconductor device.

3. A double data rate ("DDR") synchronous dynamic random access memory ("SDRAM") semiconductor device comprising:
   a delay locked loop ("DLL") circuit, which compensates for skew of an input clock signal and generates an output clock signal;
   a clock signal control unit, which receives a read signal activated when data stored in the DDR SDRAM semiconductor device is read out, a DLL locking signal activated when the DLL circuit performs a locking operation on the input clock signal, and the output clock signal, and outputs the output clock signal when either the read signal or the DLL locking signal is active;

an output unit, which buffers data stored in the DDR SDRAM semiconductor device and outputs the data to the outside of the DDR SDRAM semiconductor device, in synchronization with the output clock signal output from the clock signal control unit; and an output control unit, which receives the output clock signal, output from the clock signal control unit, and the read signal, and outputs the read signal to the output unit in synchronization with the output clock signal output from the clock signal control unit.

4. The DDR SDRAM semiconductor device of claim 3, wherein the output unit is activated when an output signal of the output control unit becomes active and the output unit is deactivated when the output signal of the output control unit becomes inactive.

5. The DDR SDRAM semiconductor device of claim 4, wherein the output signal of the output control unit becomes active when data stored in the DDR SDRAM semiconductor device is read out and the output signal of the output control unit becomes inactive when data is written to the DDR semiconductor device.

6. The DDR SDRAM semiconductor device of claim 4, wherein the output signal of the output control unit is active when it is logic high, and the output signal of the output control unit is inactive when it is logic low.

7. The DDR SDRAM semiconductor device of claim 3, wherein the DLL locking signal input to the clock signal control unit becomes active when the DLL circuit is reset.

8. The DDR SDRAM semiconductor device of claim 3, wherein the output control unit comprises:

a plurality of transmission gates, which operate in response to the output clock signal; and a plurality of latch circuits, each of which is connected between two transmission gates, latches a signal input through the transmission gate located in front of itself, and outputs the latched signal to the transmission gate located behind itself.

9. A double data rate ("DDR") synchronous dynamic random access memory ("SDRAM") semiconductor device comprising:

a delay locked loop ("DLL") circuit, which compensates for skew of an input clock signal and generates an output clock signal;

a first logic unit, which receives a read signal activated when data stored in the DDR SDRAM semiconductor device is read out, and a DLL locking signal activated when the DLL circuit performs a locking operation on the input clock signal, and activates its output signal when either the read signal or the DLL locking signal is active;

a second logic unit, which receives the output signal of the first logic unit and the output clock signal of the DLL circuit, and outputs the output clock signal when the output signal of the first logic unit is active;

an output unit, which buffers and outputs data stored in the DDR SDRAM semiconductor device, in synchronization with the output clock signal of the second logic unit; and an output control unit, which receives the output clock signal of the second logic unit and the read signal, and outputs the read signal to the output unit in synchronization with the output clock signal of the second logic unit.

10. The DDR SDRAM semiconductor device of claim 9, wherein the first logic unit is an OR gate.

11. The DDR SDRAM semiconductor device of claim 9, wherein the second logic unit is an AND gate.

12. A semiconductor memory device comprising:

a delay locked loop ("DLL") circuit for receiving an input clock signal and generating a deskewed output clock signal;

an output unit for buffering data stored within the semiconductor memory device and outputting the data; and an output control unit in signal communication with the DLL circuit and the output unit for deactivating the output unit when the DLL circuit performs a locking operation on the input clock signal.

13. A semiconductor memory device as defined in claim 12, further comprising a clock signal control unit for receiving a read signal activated when data stored in the semiconductor memory device is read out, a DLL locking signal activated when the DLL circuit performs a locking operation on the input clock signal, and the deskewed output clock signal, and outputting the deskewed output clock signal when at least one of the read signal and the DLL locking signal is active, wherein:

the output unit buffers data stored in the semiconductor memory device and outputs the data to the outside of the semiconductor memory device in synchronization with the output clock signal output from the clock signal control unit; and the output control unit receives the output clock signal output from the clock signal control unit, and the read signal, and outputs the read signal to the output unit in synchronization with the output clock signal output from the clock signal control unit.

14. A semiconductor memory device as defined in claim 13 wherein:

the output unit is activated when an output signal from the output control unit becomes active; and the output unit is deactivated when the output signal of the output control unit becomes inactive.

15. A semiconductor memory device as defined in claim 14 wherein:

the output signal from the output control unit becomes active when data stored in the semiconductor memory device is read out; and the output signal from the output control unit becomes inactive when data is written to the semiconductor memory device.

16. A semiconductor memory device as defined in claim 13 wherein the DLL locking signal input to the clock signal control unit becomes active when the DLL circuit is reset.

17. A semiconductor memory device as defined in claim 13, the output control unit comprising:

a plurality of transmission gates responsive to the output clock signal; and a plurality of latch circuits, each in signal communication between two of the plurality of transmission gates, for latching a signal input through one of the plurality of transmission gates, and outputting the latched signal to another of the plurality of transmission gates.

18. A semiconductor memory device as defined in claim 12, further comprising:

a first logic unit in signal communication with the DLL circuit for receiving a read signal activated when data stored in the semiconductor memory device is read out, and a DLL locking signal activated when the DLL circuit performs a locking operation on the input clock signal, and activating a first logic unit output signal when either the read signal or the DLL locking signal is active; and a second logic unit for receiving the output signal of the first logic unit and the output clock signal of the DLL circuit, and outputting the output clock signal when the output signal of the first logic unit is active to thereby synchronize the output unit;

wherein the output unit buffers and outputs data stored in the semiconductor memory device in synchronization with the output clock signal of the second logic unit, and the output control unit receives the output clock signal of the second logic unit and the read signal, and outputs the read signal to the output unit in synchronization with the output clock signal of the second logic unit.

19. A semiconductor memory device as defined in claim 12, the semiconductor memory device comprising a double data rate ("DDR") synchronous dynamic random access memory ("SDRAM") semiconductor device.

20. A semiconductor memory device as defined in claim 12 wherein the output control unit reactivates the output unit when the DLL circuit completes a locking operation on the input clock signal, the semiconductor memory device further comprising:

synchronization control means in signal communication with the output control unit for generating a synchronization control signal when at least one of the DLL locking signal and the output unit are active; and synchronization means in signal communication with the synchronization control means for synchronizing the output unit in response to at least one of the synchronization control signal and the deskewed output clock signal.

* * * * *